United States Patent
Huang et al.

(10) Patent No.: US 7,256,672 B2
(45) Date of Patent: Aug. 14, 2007

(54) MAGNETIC FIELD GENERATING DEVICE AND METHOD OF SHIMMING THEREOF

(75) Inventors: Jinhua Huang, Florence, SC (US); Hongliang Lu, Shanghai (CN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/385,380

(22) Filed: Mar. 21, 2006

(65) Prior Publication Data

US 2006/0158291 A1 Jul. 20, 2006

Related U.S. Application Data

(62) Division of application No. 10/710,130, filed on Jun. 21, 2004, now Pat. No. 7,019,609.

(51) Int. Cl.
*G01V 3/00* (2006.01)
*G03G 21/00* (2006.01)

(52) U.S. Cl. ............... 335/296; 335/297; 335/301; 335/306; 324/320

(58) Field of Classification Search ............... 335/216, 335/296–306; 324/318–320
See application file for complete search history.

(56) References Cited

U.S. PATENT DOCUMENTS

| | | | |
|---|---|---|---|
| 5,475,355 A | 12/1995 | Abele et al. | 335/301 |
| 5,557,205 A | 9/1996 | Ohta et al. | 324/319 |
| 6,275,128 B1 | 8/2001 | Aoki et al. | 335/299 |
| 6,794,973 B1 | 9/2004 | Aoki et al. | 335/299 |
| 2004/0246083 A1 | 12/2004 | Aoki et al. | 335/299 |

*Primary Examiner*—Ramon M. Barrera
(74) *Attorney, Agent, or Firm*—Cantor Colburn LLP

(57) ABSTRACT

A magnetic field generating device is disclosed having an arrangement of permanent magnets, each permanent magnet (PM) having a north end and a south end, and each aligned in the same north-south orientation. The PM arrangement is configured to have a surface at the north polarity end, a surface at the south polarity end, or a surface at both ends. A layer of ferromagnetic material is securely disposed at one of the surfaces of the PM arrangement, the layer having a thickness equal to or less than about 15 millimeters.

6 Claims, 5 Drawing Sheets

MAGNETIC FIELD GENERATING DEVICE AND METHOD OF SHIMMING THEREOF

CROSS REFERENCE TO RELATED APPLICATIONS

This application is a divisional application of U.S. application Ser. No. 10/710,130 filed Jun. 21, 2004, now U.S. Pat. No. 7,019,609 which is hereby incorporated by reference in its entirety.

BACKGROUND OF THE INVENTION

The present disclosure relates generally to a magnetic field generating device and method of shimming thereof, and particularly to a magnetic field generating device for use in magnetic resonance imaging (MRI).

Subjecting a substance such as a human tissue to a uniform magnetic field (a polarizing field) $B_0$ in the z-direction, not only results in the individual magnetic moments of the spins in the tissue attempting to align themselves with the polarizing field, but also results in the moments precessing about the $B_0$ field in random order at their characteristic Larmor frequency. If the substance, or tissue, is subjected to a transverse magnetic field (excitation field) $B_1$ in the x-y plane that is near the Larmor frequency, the net aligned moment, or longitudinal magnetization $M_z$, may be rotated or tipped into the x-y plane to produce a net transverse magnetic moment $M_t$. After the excitation signal $B_1$ is terminated, a signal is emitted by the relaxation of the excited spins that may be received and processed to form an image. When utilizing these emitted signals (nuclear magnetic resonant, NMR, signals) to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many reconstruction techniques.

For useful imaging, MRI magnets used in a magnetic resonant assembly not only require an intensive uniform magnetic field, typically less than 10 ppm (parts per million) of field variation within a typical 30-50 centimeter (cm) spherical volume, but also require an accurate center magnetic field value, typically less than 0.5% variation. Other magnets useful in MRI include extremity magnets, which have a substantially smaller field of view (FOV). The magnetic field of an as-manufactured magnet is often influenced by the deviation of material properties and the tolerance of manufacturing processes, resulting in a very inhomogeneous field ranging from several hundred to several thousand ppm field variation, and a non-accurate center magnetic field that is far from the desired value. To obtain the desired accuracy of center magnetic field and the desired uniformity of magnetic field in the image volume for useful imaging, it is necessary to adjust the center magnetic field and to reduce the field inhomogeneity to desired values. For a permanent magnet (PM) design absent a poleface, that is, a PM absent a surface having the function of shifting the direction of the local field lines, a shim holder is typically employed for holding a PM shim that is used for adjusting the $B_0$ field and homogeneity. The use of a shim holder may be costly, inconvenient and space inefficient, thereby consuming precious patient gap at a high cost.

Accordingly, there is a need in the MRI art for a magnetic field generating device and method of shimming thereof that overcomes these drawbacks.

BRIEF DESCRIPTION OF THE INVENTION

Embodiments of the invention include a magnetic field generating device having an arrangement of permanent magnets, each permanent magnet (PM) having a north end and a south end, and each aligned in the same north-south orientation. The PM arrangement is configured to have a surface at the north polarity end, a surface at the south polarity end, or a surface at both ends. A layer of ferromagnetic material is securely disposed at one of the surfaces of the PM arrangement, the layer having a thickness equal to or less than about 15 millimeters.

Embodiments of the invention further include a magnetic field generating device having a PM with a north polarity end and a south polarity end, and a surface at the north polarity end, at the south polarity end, or at both ends. A layer of ferromagnetic material is securely disposed at one of the surfaces of the PM, the layer having a thickness equal to or less than about 15 millimeters.

Embodiments of the invention also include a magnetic field generating device having a PM having a north polarity end and a south polarity end, and a surface at the north polarity end, at the south polarity end, or at both ends. A non-ferromagnetic shim plate having a plurality of pockets is disposed at the surface of the PM. A transition layer of ferromagnetic material is securely disposed at one or more of the pockets of the shim plate. A PM shim is disposed at an opposite side of the layer to the PM, the layer having a thickness equal to or less than about 15 millimeters.

Embodiments of the invention further include a method for shimming a magnetic field generating device. A plurality of PMs are positioned to form an arrangement, each PM having a north end and a south end, and each aligned in the same north-south orientation, the plurality being positioned to have a surface at the north polarity end of the PM arrangement, a surface at the south polarity end of the PM arrangement, or a surface at both ends of the PM arrangement. A layer having a ferromagnetic material is positioned to be securely disposed at one of the surfaces of the PM arrangement, the layer having a thickness equal to or less than about 15 millimeters.

Embodiments of the invention include another method for shimming a magnetic field generating device. A plurality of PMs are positioned to form an arrangement, each PM having a north end and a south end, and each aligned in the same north-south orientation, the plurality being positioned to have a surface at the north polarity end of the PM arrangement, a surface at the south polarity end of the PM arrangement, or a surface at both ends of the PM arrangement. A shim assembly is formed having a layer of ferromagnetic material securely disposed at a pole face of a PM shim. The shim assembly is securely positioned at a surface of the PM arrangement, the layer of the shim assembly being positioned proximate the surface of the PM arrangement. The layer has a thickness equal to or less than about 15 millimeters.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention provides a magnetic field generating device (device) for use in magnetic resonance imaging (MRI). An embodiment of the device includes an arrangement of permanent magnet (PM) blocks having a thin transition layer disposed at one or more ends of the PM arrangement, and one or more ferromagnetic or permanent magnet shims positioned on top of the transition layer for controlling a resultant $B_0$ magnetic field and magnetic field homogeneity. While embodiments described herein depict an arrangement of a plurality of PM blocks as an exemplary arrangement of permanent magnets, it will be appreciated that the disclosed invention may also be applicable to other permanent magnet structures, such as a small extremity permanent magnets for example.

Figure 1:
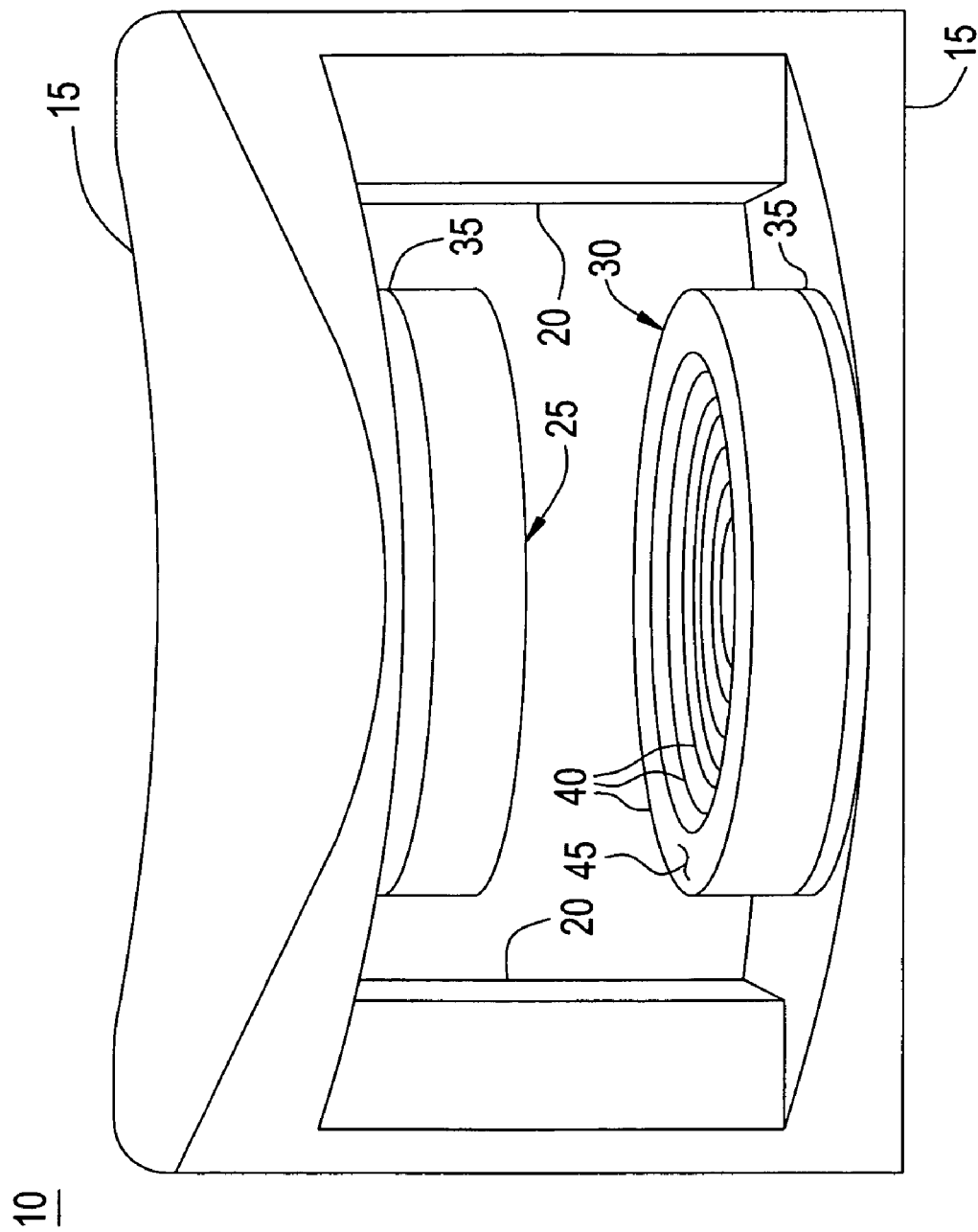
FIG. 1 depicts a magnet assembly for use in accordance with embodiments of the invention.

FIG. 1 is an exemplary embodiment of a MRI magnet assembly 10 having yokes 15, connecting posts 20, an upper PM arrangement 25, a lower PM arrangement 30, and intermediate base plates 35 made of a ferrous material. In an exemplary embodiment, and as depicted in FIG. 1, upper and lower PM arrangements 25, 30 may include a plurality of PM magnets 40, with each magnet 40 having different heights and a planar surface 45, and each magnet 40 being made of a plurality 105 of PM blocks 110, which is best seen by referring to FIG. 2. While FIG. 1 depicts a concentric arrangement of PM magnets 40, it will be appreciated that this is illustrative only, and that the shape of the upper and lower PM arrangements 25, 30 may vary widely by design. For example, upper and lower PM arrangements 25, 30 may be symmetrical, non-symmetrical, circular, or non-circular. In an embodiment, and in order to optimize the design of magnet assembly 10 for field homogeneity, PM arrangements 25, 30 may be non-symmetrical in order to compensate for the non-symmetrical arrangement of yokes 15 and posts 20.

Figure 2:
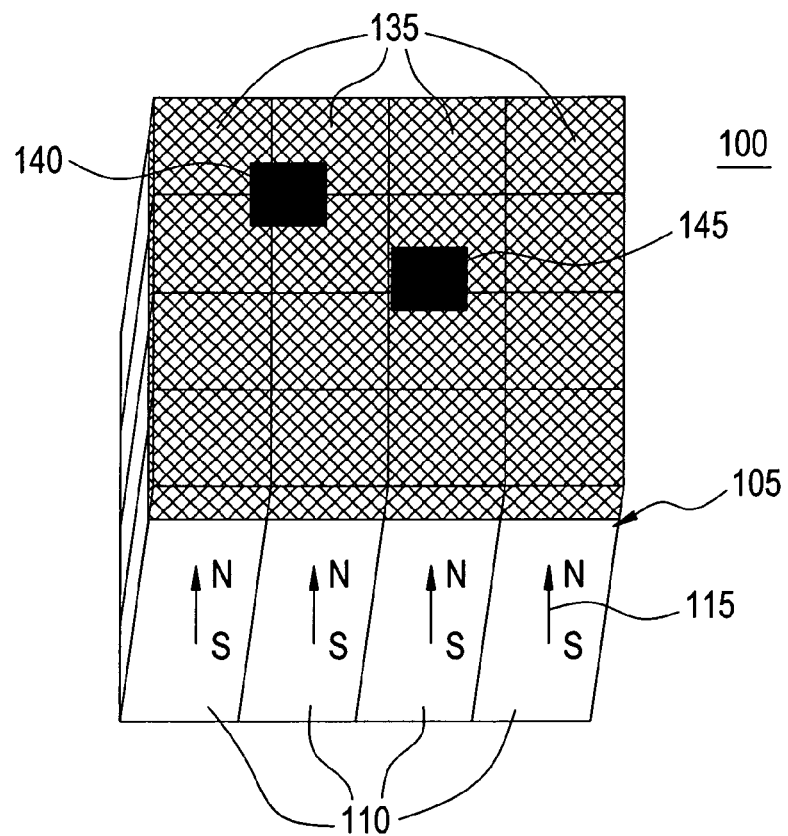
FIG. 2 depicts a portion of an exemplary shimming arrangement for a magnetic field generating device in accordance with embodiments of the invention.
Figure 3:
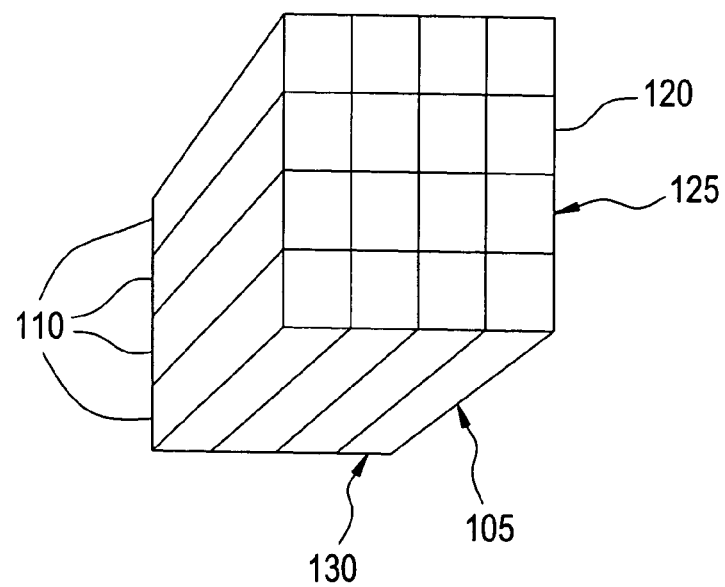
FIG. 3 depicts an exemplary portion of the device of FIG. 2.

FIG. 2 is an exemplary embodiment of a portion of a magnetic field generating device (device) 100, which may be used to produce each magnet 40 of magnet assembly 10 for example, including a plurality 105 of PM blocks 110. Plurality 105 of PM blocks 110 is also herein referred to as a PM arrangement 105. Each PM block 110 has a north end and a south end, indicated generally by arrows 115, where each PM block 110 is aligned in the same north-south orientation. PM arrangement 105 is configured having a planar surface 120, best seen by referring to FIG. 3, at the north polarity end (north pole face) 125, at the south polarity end (south pole face) 130, or at both ends 125, 130. In an embodiment, planar surface 120 of FIG. 3 is synonymous with planar surface 45 of FIG. 1. While surfaces 45 and 120 are discussed and illustrated as being planar, it will be appreciated that other surface contours may be equally suitable for practicing embodiments of the invention disclosed herein, and that the disclosed invention is not so limited. A transition layer 135 made from ferromagnetic material, having a thickness equal to or less than about 30 millimeters (mm), preferably equal to or less than about 15 mm, and more preferably equal to or less than about 5 mm, is securely disposed at end 125 of PM arrangement 105, which may be a north or a south end. In an embodiment, transition layer 135 is disposed at both ends 125, 130 of PM arrangement 105.

The ferromagnetic material used for layer 135 may be low carbon steel, silicon steel, or any other steel exhibiting ferromagnetic properties suitable for the purpose disclosed herein. In an embodiment, layer 135 is adhered to planar surface 125 of PM arrangement 105 using any adhesive suitable for the purpose, such as an epoxy for example. In an alternative embodiment, fasteners may be used in place of an adhesive to securely fasten layer 135 to PM arrangement 105. Layer 135 may be individual tiles, with one tile for each PM block 110 as depicted in FIG. 2, or a single sheet covering multiple PM blocks 110. Layer 135 preferably includes discontinuities in order to reduce the presence of eddy currents, thereby making segmented tiles preferable over one large single sheet. While layer 135 may be composed of laminations, layer 135 is preferably composed of a unilayer (single layer) absent a plurality of laminations. Whether layer 135 is a laminated arrangement or a unilayer arrangement, layer 135 has an overall thickness in accordance with embodiments of the invention disclosed herein.

To control the resultant $B_0$ magnetic field generated by device 100, permanent magnet shims 140, 145 are strategically placed on layer 135 on an opposite side of layer 135 to PM arrangement 105 using any number of shimming strategies, including computer analysis using statistical or linear programming methods. Shims 140, 145 may have the same polarity as PM arrangement 105, represented by shim 140, or a reversed polarity compared to PM arrangement 105, represented by shim 145, depending on how the $B_0$ field of plurality of blocks 105 needs to be modified. While only two shims 140, 145 are depicted in FIG. 2, it will be appreciated that a single or a plurality of shims 140, 145 may be employed as needed to control the $B_0$ magnetic field and homogeneity as desired. Usually, the purpose for shimming is to generate a homogeneous field, however, the purpose may alternatively be to generate a field of a desired gradient characteristic. In an embodiment, shims 140, 145 are adhered to layer 135 using any adhesive or anchoring means suitable for the purpose.

Figure 4:
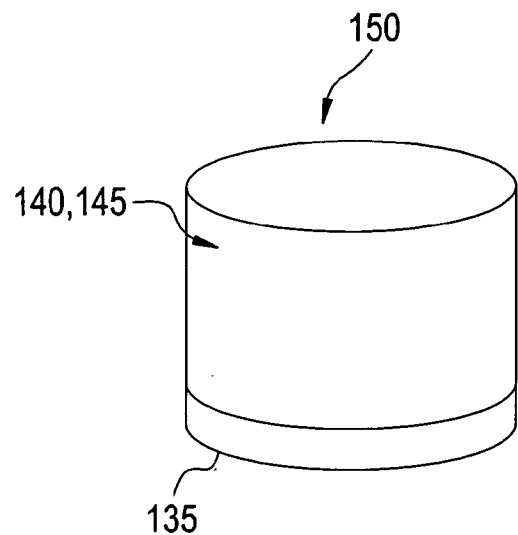
FIGS. 4 and 5 depict other exemplary portions of the device of FIG. 2.
Figure 5:
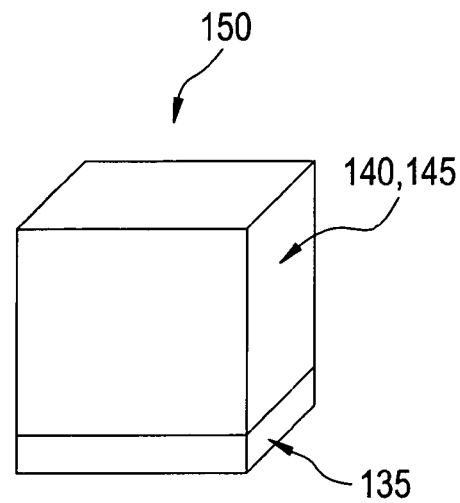

In an alternative embodiment, and referring now to FIGS. 4 and 5 that illustrate rectangular and cylindrical shims, respectively, transition layer 135 may be placed on a north or south pole planar surface of shim 140, 145 to form a shim assembly 150. The embodiments of FIGS. 4 and 5 differ from the embodiment of FIG. 2 in that FIG. 2 depicts transition layer 135 disposed on a magnet pole face of PM arrangement 105, while FIGS. 4 and 5 depict transition layer 135 disposed on shim 140, 145. An advantage to arranging layer 135 on shim 140, 145 is to reduce eddy currents and residual magnetization at device 100. As discussed previously, layer 135 may have a thickness equal to or less than about 30 mm, preferably equal to or less than about 15 mm, and more preferably equal to or less than about 5 mm. As also discussed previously, layer 135 may be secured to shim 140, 145 using an adhesive or other suitable means.

Figure 6:
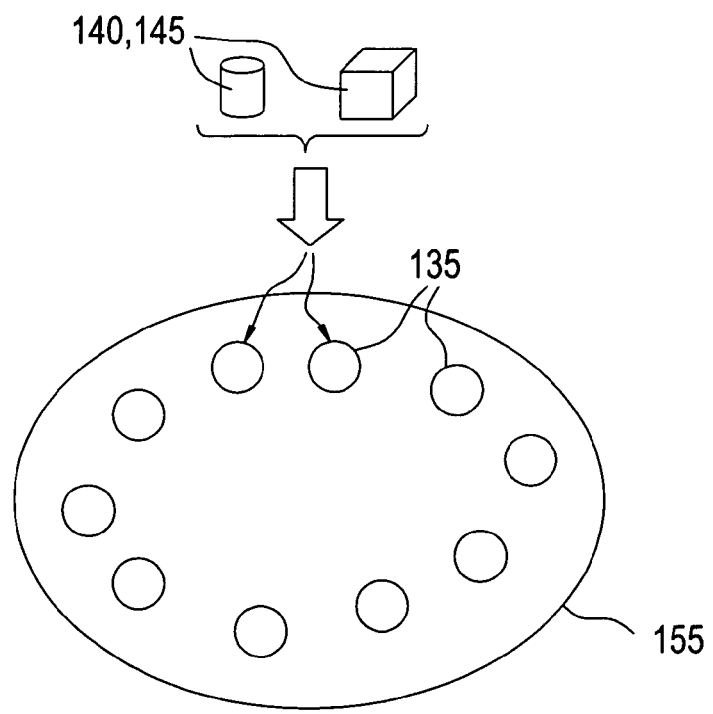
FIG. 6 depicts an alternative shimming arrangement for a magnetic field generating device in accordance with embodiments of the invention.

In a further alternative embodiment, and referring now to FIG. 6, a shim plate 155 may be used for receiving transition layer 135 and PM shims 140, 145, which may be combined as shim assembly 150. Shim plate 155 may be flat or may have pockets for receiving discrete segments of transition layer 135. Alternatively, transition layer 135 may be a whole sheet of ferrous material with portions removed (discontinuities) at strategic locations. Shim plate 155 may be a molded part, and may have transition layer segments or transition layer sheet 135 molded therein.

The thickness of layer 135 is sized to permit local reversal of the magnetization between PM arrangement 105 and shim 140, 145 without shifting the magnetic field at layer 135. In an embodiment, layer 135 may have a thickness equal to or less than about 30 mm, equal to or less than about 15 mm, equal to or less than about 5 mm, equal to or less than about 2 mm, or equal to or less than about 1 mm, and may have a thickness equal to or greater than about 0.1 mm or equal to or greater than about 0.2 mm. The thickness of layer 135 and the size and number of shims 140, 145 are chosen so as to provide an intensive uniform magnetic field, typically having a variation of less than about 10 ppm (parts per million) within a 30-50 centimeter (cm) spherical volume, with an accurate center magnetic field value having typically less than about 0.5% variation. By employing embodiments of the invention, it may be possible to control the $B_0$ field of device 100 to within less than or equal to 1 Gauss from a target value.

The use of a thin layer 135 that does not shift the $B_0$ field lines at layer 135, effectively converts a PM design absent a poleface into a design that possesses properties of a PM having a poleface. As used herein, the term poleface refers to a PM design having a functional surface (a poleface, which is usually composed of thick laminated tiles of ferrous material greater than 20 mm in thickness) that shapes the magnetic field to provide a uniform magnetic field region, which is not the intended function of layer 135 of the disclosed invention.

Figure 7:
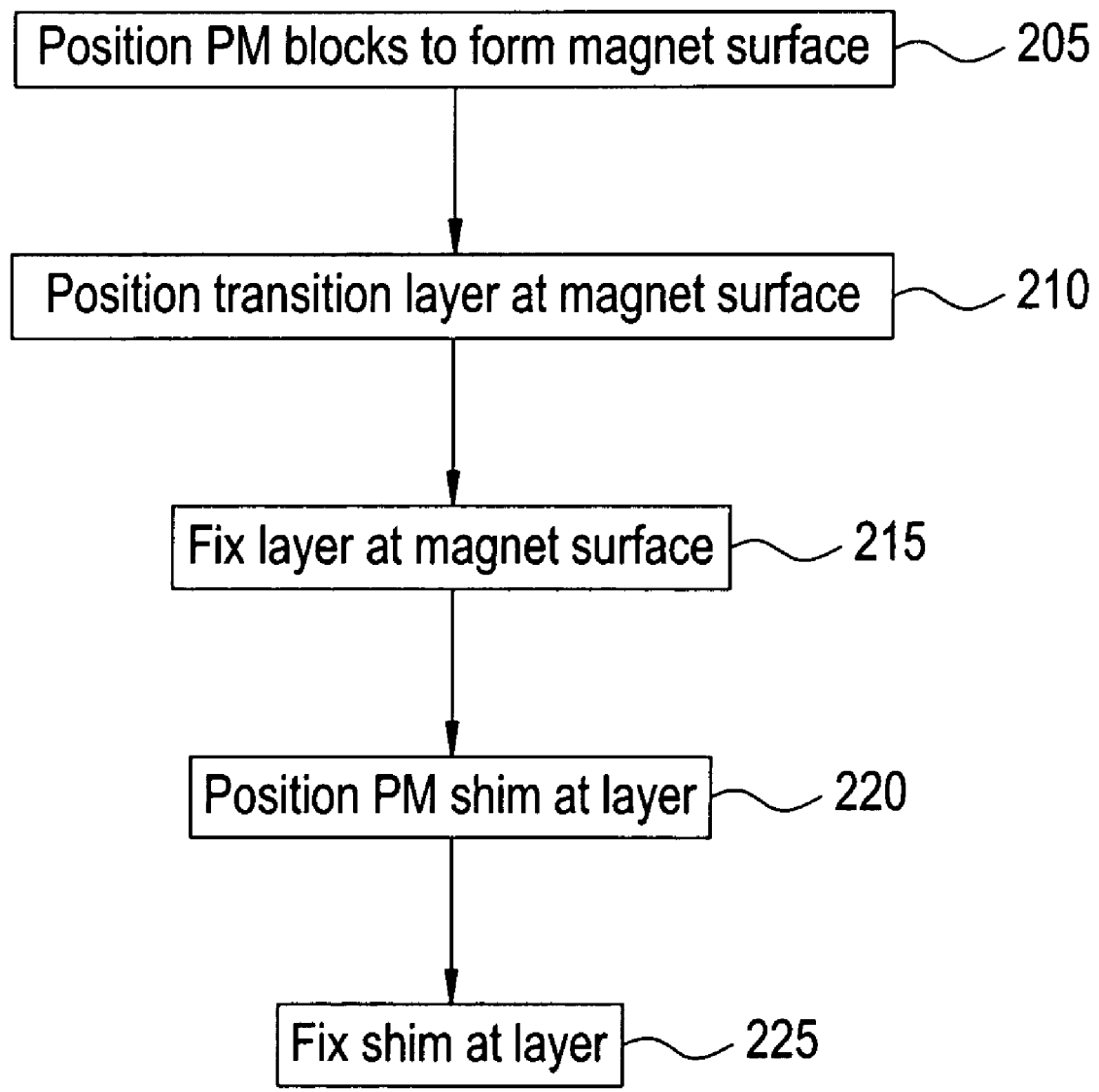
FIG. 7 depicts an exemplary method for shimming the device of FIG. 2.

In view of the foregoing, the shimming of magnetic field generating device 100 may be accomplished according to the method 200 depicted in FIG. 7. At 205, a plurality 105 of permanent magnet blocks 110 are positioned to form a PM arrangement 105 having multiple planar surfaces, such as at the north polarity end 125, at the south polarity end 130, or at both ends 125, 130. Each permanent magnet block 110 is aligned in the same north-south orientation.

At 210, a transition layer 135 made from ferromagnetic material is securely positioned at planar surface 125 or 130 of PM arrangement 105.

At 215, layer 135 is securely fixed via an adhesive, or otherwise, to PM arrangement 105.

At 220, one or more ferromagnetic or permanent magnet shims 140, 145 are positioned to a side of layer 135 opposite that of PM arrangement 105, and at 225, shims 140, 145 are securely fixed via an adhesive, or otherwise, to layer 135.

Figure 8:
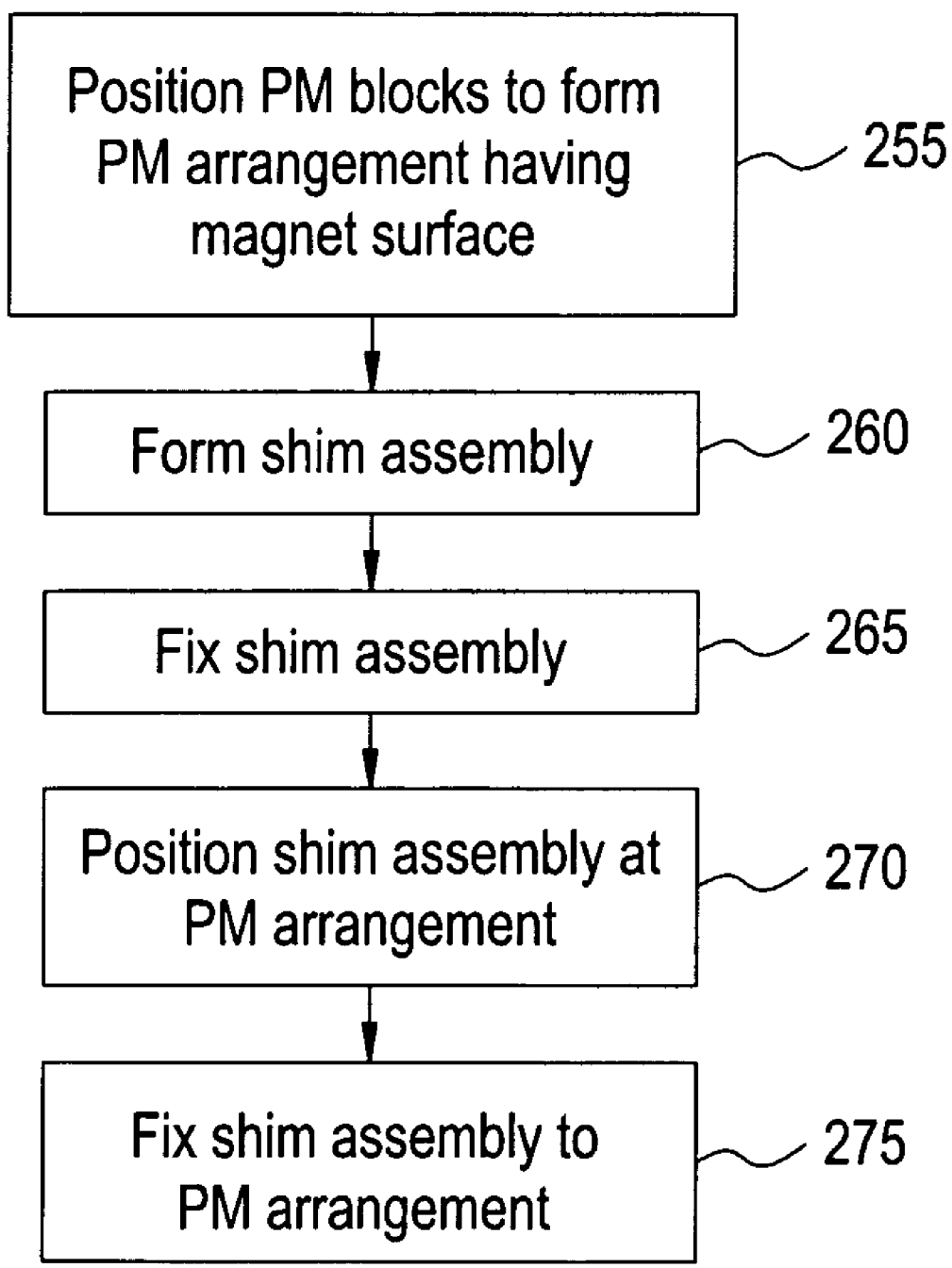
FIG. 8 depicts an alternative method to that of FIG. 7.

An alternative method for shimming magnetic field generating device 100 may be accomplished according to the method 250 depicted in FIG. 8. At 255, a plurality 105 of permanent magnet blocks 110 are positioned to form a PM arrangement 105 having multiple planar surfaces, such as at the north polarity end 125, at the south polarity end 130, or at both ends 125, 130. Each permanent magnet block 110 is aligned in the same north-south orientation.

At 260, a transition layer 135 made from ferromagnetic material is securely positioned at a pole face of a PM shim 140, 145 to form a shim assembly 150.

At 265, layer 135 is securely fixed via an adhesive, or otherwise, to PM shim 140, 145, thereby fixing shim assembly 150.

At 270, shim assembly 150 is positioned at an end 125, 130 of PM arrangement 105, with transition layer 135 being placed proximate the pole face surface of end 125 or 130, and at 275, shim assembly 150 is securely fixed via an adhesive, or otherwise, to PM arrangement 105.

While embodiments of the invention depict a magnetic field generating device 100 having shims 140, 145 made of a permanent magnet material for controlling the $B_0$ field and homogeneity, it will be appreciated that shims 140, 145 may also be made of ferromagnetic material for adjusting and controlling the $B_0$ field.

As disclosed, some embodiments of the invention may include some of the following advantages: the ability to locally enhance or reduce the strength of the magnetic field, including the field at the center of the FOV (field of view); the ability to locally control the $B_0$ field using a single layer of ferromagnetic material, thereby achieving size and cost savings; the ability to use a reverse polarity permanent magnet shim for adjusting and controlling the $B_0$ field; the ability to control the $B_0$ field to within less than or equal to 1 Gauss from a target value; the ability to effectively convert a PM design absent a poleface into a design that possesses properties of a PM having a poleface; and, the ability to shim a PM device to a high degree of homogeneity with accurate B0 field, while conserving the patient gap and minimizing the shimming cost.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. A method for shimming a magnetic field generating device, comprising:

positioning a plurality of permanent magnets (PM) to form an arrangement, each permanent magnet having a north end and a south end, and each aligned in the same north-south orientation, the plurality positioned to have a surface at the north polarity end of the PM arrangement, a surface at the south polarity end of the PM arrangement, or a surface at both ends of the PM arrangement;

forming a shim assembly having a layer comprising a ferromagnetic material securely disposed at a pole face of a PM shim; and securely positioning the shim assembly at a surface of the PM arrangement, the layer of the shim assembly being positioned facing the surface of the PM arrangement, and the PM shim being positioned on a side of the layer opposite that of the PM arrangement;

wherein the layer has a thickness equal to or less than about 15 millimeters.

2. The method of claim 1, further comprising:
securely fixing the layer to the PM shim.

3. The method of claim 2, further comprising:
securely fixing the shim assembly to to PM arrangement.

4. The method of claim 3, wherein the layer comprises a unilayer absent a plurality of laminations.

5. The method of claim 1, wherein the forming and positioning the shim assembly, comprises:

forming and positioning the shim assembly such that the PM shim has a polarity the same as that of the PM arrangement.

6. The method of claim 1, wherein the forming and positioning the shim assembly, comprises:

forming and positioning the shim assembly such that the PM shim has a polarity different from that of the PM arrangement.

* * * * *